(12) United States Patent
Shin et al.

(10) Patent No.: US 6,281,761 B1
(45) Date of Patent: Aug. 28, 2001

(54) TEMPERATURE-ADAPTIVE CAPACITOR BLOCK AND TEMPERATURE-COMPENSATED CRYSTAL OSCILLATOR USING IT

(75) Inventors: Hyung Cheol Shin; Hoi Jun Yoo, both of Taejun; Min Kyu Je, Kongki-do; Seung Ho Han, Pusan, all of (KR)

(73) Assignee: Korea Advanced Institute of Science and Technology, Taejun (KR)

( * ) Notice: Subject to any disclaimer, the term of this patent is extended or adjusted under 35 U.S.C. 154(b) by 0 days.

(21) Appl. No.: 09/570,484

(22) Filed: May 12, 2000

(30) Foreign Application Priority Data

May 14, 1999 (KR) .................................................. 99-17281

(51) Int. Cl.[7] .............................. H01G 4/38; H03B 5/36; H03L 1/02
(52) U.S. Cl. .................................. 331/116 FE; 331/158; 331/176; 331/179
(58) Field of Search .......................... 331/116 R, 116 FE, 331/158, 176, 179

(56) References Cited

U.S. PATENT DOCUMENTS

| 5,117,206 |   | 5/1992  | Imamura   | 331/158 |
| 5,204,975 | * | 4/1993  | Shigemori | 455/231 |
| 5,994,970 | * | 11/1999 | Cole et al. | 331/176 |

OTHER PUBLICATIONS

Uno et al., "A New Digital TCXO Circuit Using a Capacitor-Switch Array", IEEE International Frequency Control Symposium, pp. 434–441, 1983.

Huang et al., "Design Considerations for High–Frequency Crystal Oscillators Digitally Trimmable to Sub–ppm Accuracy", IEEE Transactions on VLSI Systems, vol. 5 No. 4. pp. 408–416, Dec. 1997.

* cited by examiner

*Primary Examiner*—Siegfried H. Grimm
(74) *Attorney, Agent, or Firm*—Akin, Gump, Strauss, Hauer & Feld, L.L.P.

(57) ABSTRACT

A temperature-adaptive capacitor array used in a TCXO so that the TCXO effectively conducts temperature-compensating in the resonant frequency without the non-monotonicity while a smaller silicon area is used in producing the capacitor array. A number of capacitor arrays allocated in two capacitor banks. Each of the capacitor arrays comprises two or more unit cells, and in turn each unit cell consists of a unit capacitor and a switching element, respectively. All of unit capacitors included in the capacitor arrays are connected each other through a decoder assembly to provide a crystal oscillator with a load capacitance. The unit capacitors belonging to one of the capacitor arrays have the same capacitance with each other. Two unit capacitors belonging to different capacitor arrays, however, have different capacitances from each other. The capacitance of the unit capacitors belonging to each capacitor array is set in consideration of control preciseness required in compensating a frequency deviation in the resonant frequency of the crystal oscillator as the temperature varies in at least a portion of a practical temperature range, within which the crystal oscillator operates.

10 Claims, 6 Drawing Sheets

TEMPERATURE-ADAPTIVE CAPACITOR BLOCK AND TEMPERATURE-COMPENSATED CRYSTAL OSCILLATOR USING IT

TECHNICAL FIELD

This invention relates to a capacitor array used in a temperature-compensated crystal oscillator (TCXO), more particularly, to the capacitor used in constituting a temperature-adaptive capacitor bank for keeping a constant resonant frequency of a crystal oscillator by varying a load capacitance on the crystal oscillator although a temperature surrounding the crystal resonator varies.

BACKGROUND OF THE INVENTION

A conventional analog TCXO has a thermistor network and a variable reactance diode, in which the thermistor network varies a voltage applied to the variable reactance diode as a prevailing temperature varies, and then the capacitance of the variable reactance diode varies. In other words, if the thermistor network senses any variation in the temperature, then the capacitance of the variable reactance diode varies to compensate a frequency deviation in a resonant frequency due to variation in the temperature.

The analog TCXO, however, can not keep so precisely the resonant frequency and can not be implemented in a integrated circuit.

As it is needed to keep the resonant frequency more precisely, a digital TCXO as shown in FIG. 1 was developed.

The digital TCXO consists of a temperature sensor 11, an analog-to-digital (AD) converter 12, a digital memory 13, a digital-to-analog (DA) converter 14, a variable reactance diode 15 and a crystal oscillator 16. The temperature sensor 11 is preferably formed in a temperature sensing circuit.

The temperature sensor 11 operates to sense a surrounding temperature of the crystal oscillator 16 and to output an electric signal corresponding to the surrounding temperature. The electric signal outputted in analog form is converted to a digital signal by the AD converter 12 and provided to the digital memory 13. The digital signal is used as address information of the digital memory 13. From the corresponding address of the digital memory 13, a capacitor array control code used in compensating a frequency deviations in the resonant frequency at the surrounding temperature is obtained. In the digital memory 13, voltage values applied to the variable reactance diode 15 to compensate frequency deviations in the resonant frequency due to variation of the surrounding temperature is recorded in the form of digital codes.

The capacitor array control code obtained from digital memory 13 is converted into an analog voltage level by the DA converter 14 and provided to the variable reactance diode 15. The variable reactance diode 15 varies its capacitance to compensate a frequency deviation in the resonant frequency of the crystal oscillator 16 due to variation of the surrounding temperature.

The digital TCXO can precisely keep the resonant frequency although the surrounding temperature varies. However, the variable reactance diode used in the digital TCXO prevents the digital TCXO from being implemented in an integrated circuit.

Another digital TCXO developed to solve this problem in the digital TCXO having the variable reactance diode is shown in FIG. 2. In this digital TCXO, therefore, a DA converter and a variable reactance diode are replaced with a capacitor array as shown in FIG. 3.

The capacitor array is formed of a plurality of unit cells 30. Each unit cell has a unit capacitor 31 and a switching element 32. One node of each unit capacitor 31 is connected to a crystal oscillator. Therefore, the load capacitance of the crystal oscillator is defined by combination of capacitances of all of the unit capacitors. The switching element 32 is inserted between the other node of the unit capacitor and an earth. Operation of the switching element 32 of each unit cell 30 is controlled by a control code provided from a memory.

Capacitances of the unit capacitors have either a constant value or different values, respectively. It is also possible that capacitances of only some other than all of the unit capacitors have a constant value.

In order to precisely compensate a frequency deviation in a large gradient region of a compensation curve shown in FIG. 4, a unit capacitor having a very small capacitance value is required. In a small gradient region, for example, in a region between Point A and Point B on the compensation curve shown in FIG. 4, however, it is not required to finely divide capacitance values obtained by combining capacitances of the unit capacitors. Thus, using unit capacitors having a constant value that is inevitably a very small capacitance value is not so desirable since a capacitance value required to compensate a frequency deviation in a small gradient region of a compensation curve is obtained by combining capacitances of an extravagant number of unit capacitors. Increasing the number of unit capacitors results in increasing the number of switching elements, increasing the number of bits constituting the control code, complicating a decoding logic, increasing an area required to connecting the unit cells with each other, and finally increasing the area of a silicon chip used in producing the capacitor array.

In order to reduce the silicon area used in producing the unit capacitors, unit capacitors having different capacitances, preferably increased by doubling, are used. Although decreased the number of unit cells and the silicon area used in the capacity array formed of unit capacitors having different capacitances, there is a problem of non-monotonicity.

In the capacitor array formed of a series of unit capacitors having capacitances increased by double of an immediately lower capacitance, an actual capacitance of a unit capacitor may be smaller than an ideal capacitance of the unit capacitor due to an inevitable tolerance in a semiconductor manufacture process. If the difference between the actual capacitance and the ideal capacitance of the unit capacitor is larger than an actual capacitance of another unit capacitor defined to have a lower ideal capacitance, a total load capacitance is decreased rather than increased when a unit capacitor is switched on while another unit capacitors defined to have a lower ideal capacitances are switched off by increasing the value of the control code. "Non-monotonicity" means the phenomenon that the load capacitance is decreased when the value of the control code is increased. In order to avoid the non-monotonicity, the minimum capacitance of a unit capacitor is limited over a reasonable capacitance. This limitation results in increasing a total capacitance used in temperature-compensating, and in turn increasing electric power consumption.

SUMMARY OF THE INVENTION

This invention is aimed to propose a temperature-adaptive capacitor array used in a TCXO so that the TCXO effectively conducts temperature-compensating in the resonant frequency without the non-monotonicity while a smaller silicon area is used in producing the capacitor array.

The temperature-adaptive capacitor array according to this invention is used in constituting a temperature-adaptive capacitor bank for keeping a constant resonant frequency of a crystal oscillator by varying a load capacitance on the crystal oscillator although a temperature surrounding the crystal resonator varies.

The temperature-adaptive capacitor bank comprises a number of capacitor arrays comprising unit capacitors adapted to be individually switched on or off and operatively connected to the crystal oscillator to produce a load capacitance on the crystal oscillator. The unit capacitors belonging to one of the capacitor arrays have the same capacitance with each other. Two unit capacitors belonging to different capacitor arrays, however, have different capacitances from each other. The capacitance of the unit capacitors belonging to each capacitor array is set in consideration of control preciseness required in compensating a frequency deviation in the resonant frequency of the crystal oscillator as the temperature varies in at least a portion of a practical temperature range, within which the crystal oscillator operates.

Preferably, the temperature-adaptive capacitor bank comprises the same number of capacitor arrays with the number of zones divided from the practical temperature range in consideration of variation of the resonant frequency of the crystal oscillator as the load capacitance on the crystal oscillator varies.

It is preferred for the capacitor arrays and the zones divided from the practical temperature range correspond to each other by one to one. In such a case, the capacitance of the unit capacitors belonging to one of the capacitor arrays is set in consideration of control preciseness required in compensating a frequency deviation in the resonant frequency of the crystal oscillator as the temperature varies in one of the zones to which the one of the capacitor arrays corresponds.

The capacitance of the unit capacitors belonging to one of the capacitor arrays is decreasingly set as the variation of the resonant frequency of the crystal oscillator is increased as the load capacitance on the crystal oscillator varies.

The temperature-adaptive capacitor bank further comprise switching elements provided to the unit capacitors by one by one.

According to another aspect of the invention, there is provided a temperature-compensated crystal oscillator for outputting a constant resonant frequency of a crystal oscillator by varying a load capacitance on the crystal oscillator although a temperature surrounding the crystal oscillator varies. The temperature-compensated crystal oscillator comprises a temperature sensor for sensing the temperature surrounding the crystal resonator, one or more temperature-adaptive capacitor banks connected to the crystal oscillator, and a control unit for controlling the temperature-adaptive capacitor banks to produce a proper load capacitance on the crystal oscillator as the temperature varies. Each temperature-adaptive capacitor bank comprises a number of capacitor arrays comprising unit capacitors being individually switched on or off and operatively connected to the crystal oscillator. The unit capacitors belonging to one of the capacitor arrays have the same capacitance with each other. Two unit capacitors belonging to different capacitor arrays, however, have different capacitances from each other. The capacitance of the unit capacitors belonging to each capacitor array is set in consideration of control preciseness required in compensating a frequency deviation in the resonant frequency of the crystal oscillator as the temperature varies in at least a portion of a practical temperature range, within which the crystal oscillator operates.

Preferably, the temperature-compensated crystal oscillator further comprises switching elements provided to the unit capacitors by one by one, and a memory for storing control codes used for switching on or off the unit capacitors in accordance with the temperature surrounding the crystal oscillator sensed by the temperature sensor. In such a case, the control unit operates to switch on or off each unit capacitor in accordance with a control code selected in consideration of the temperature so that the temperature-adaptive capacitor banks produce a proper load capacitance on the crystal oscillator.

BRIEF DESCRIPTION OF THE DRAWINGS

Several preferred embodiment f the temperature-adaptive capacitor bank and the temperature-compensated crystal oscillator using it in accordance with the present invention will be explained with reference to the accompanying drawings, in which.

DETAILED DESCRIPTION OF THE INVENTION

Figure 6:
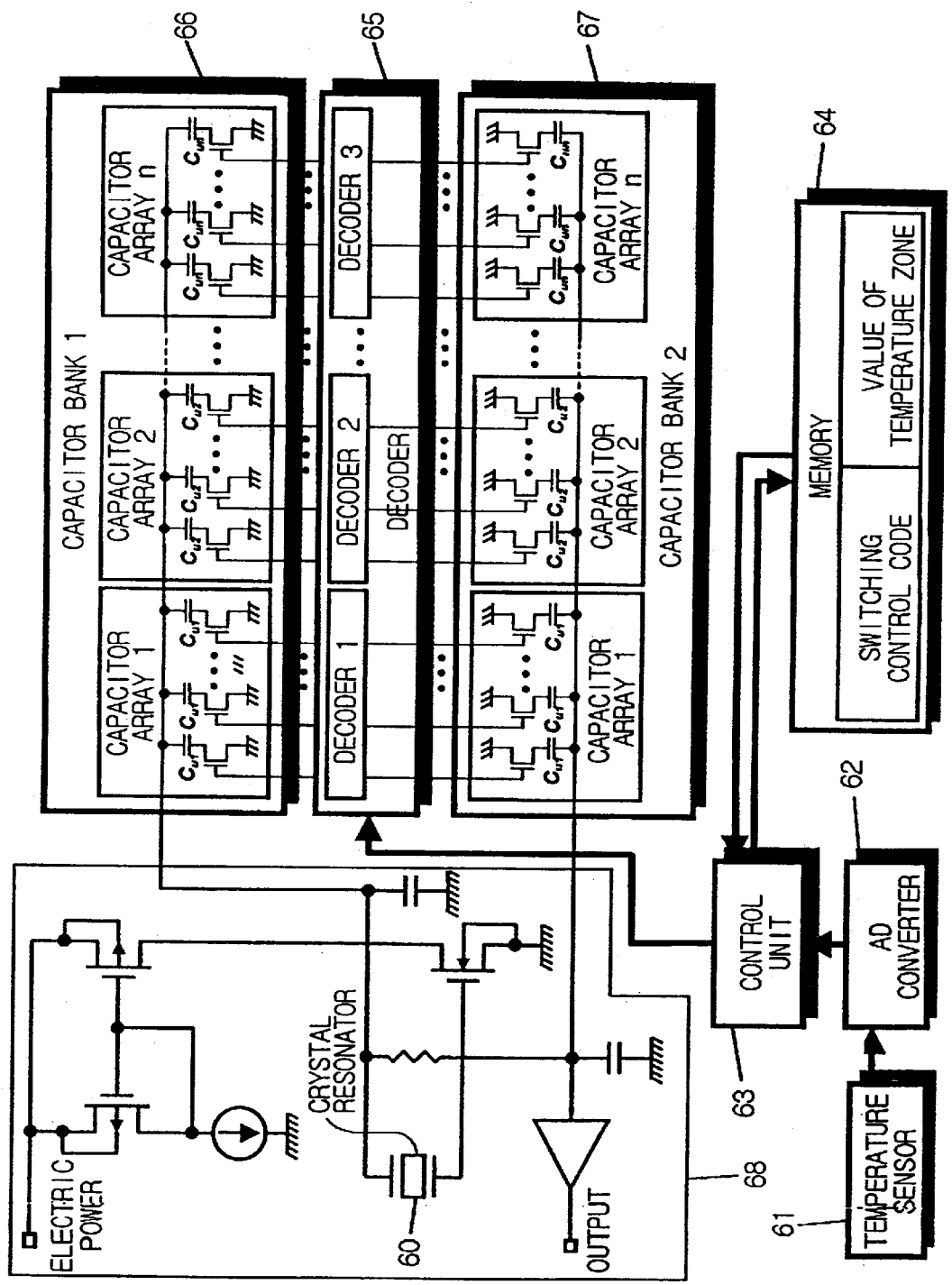
FIG. 6 shows a circuit of a temperature-compensated crystal oscillator using a temperature-adaptive capacitor bank according to a preferred embodiment of this invention.

As shown in FIG. 6, a temperature-adaptive capacitor bank in accordance with a preferred embodiment of this invention consists of a number of capacitor arrays allocated in two capacitor banks 66 and 67. Each of the capacitor arrays comprises two or more unit cells, and in turn each unit cell consists of a unit capacitor and a switching element, respectively. The entire unit capacitors included in the capacitor arrays are connected to each other through a decoder assembly 65 to provide a crystal oscillator 68 with a load capacitance.

Hereinafter, it will be explained how a proper capacitance of each unit capacitor is decided.

Figure 5:
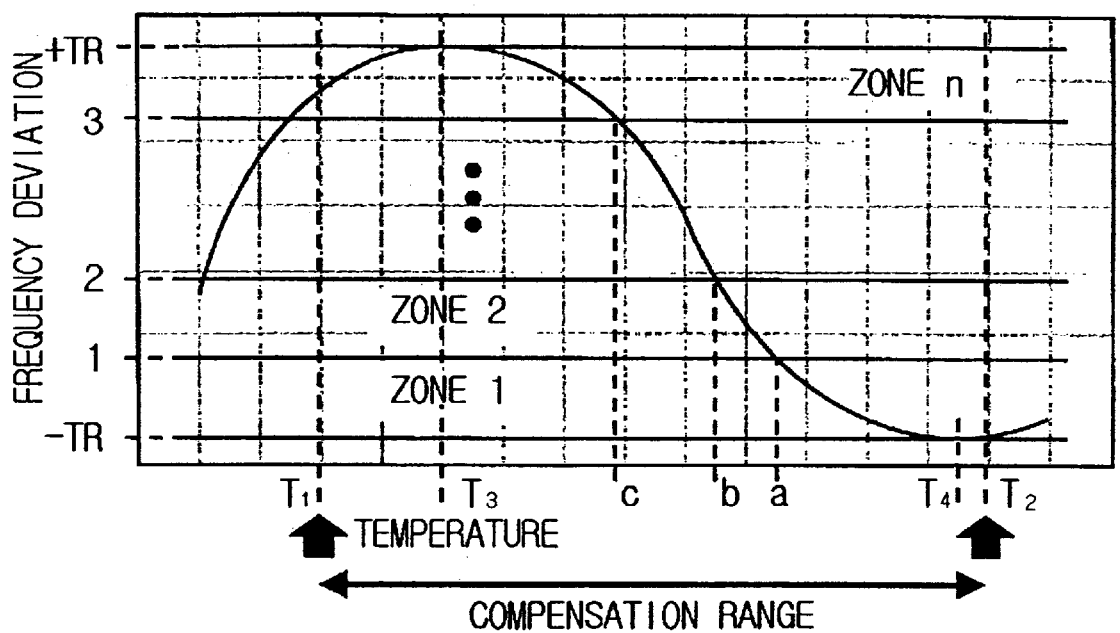
FIG. 5 shows a graph for illustrating variation in a resonant frequency of a crystal oscillator as a temperature surrounding the crystal oscillator varies.

A graph for exemplifying variation in a resonant frequency of the crystal resonator as a surrounding temperature varies is shown in FIG. 5. Accordingly, an appropriate temperature compensation is required to obtain a constant resonant frequency from the crystal oscillator. As shown in FIG. 5, if a practical temperature range $T_1$ through $T_2$ is decided, the resonant frequency varies in a range of frequency deviation between +TR and −TR.

Figure 1:
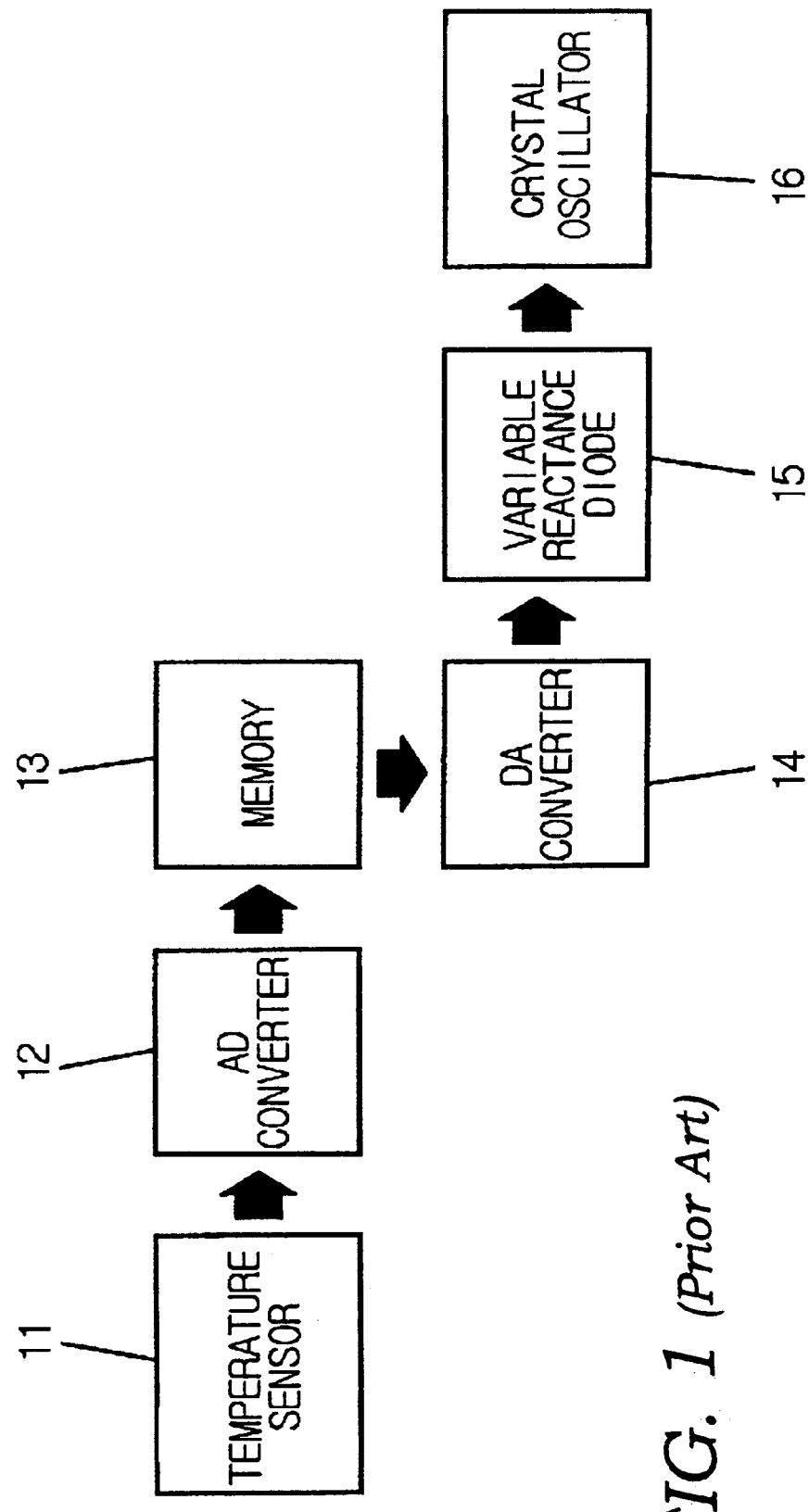
FIG. 1 shows a block diagram for illustrating a conventional digital temperature-compensated crystal oscillator.
Figure 2:
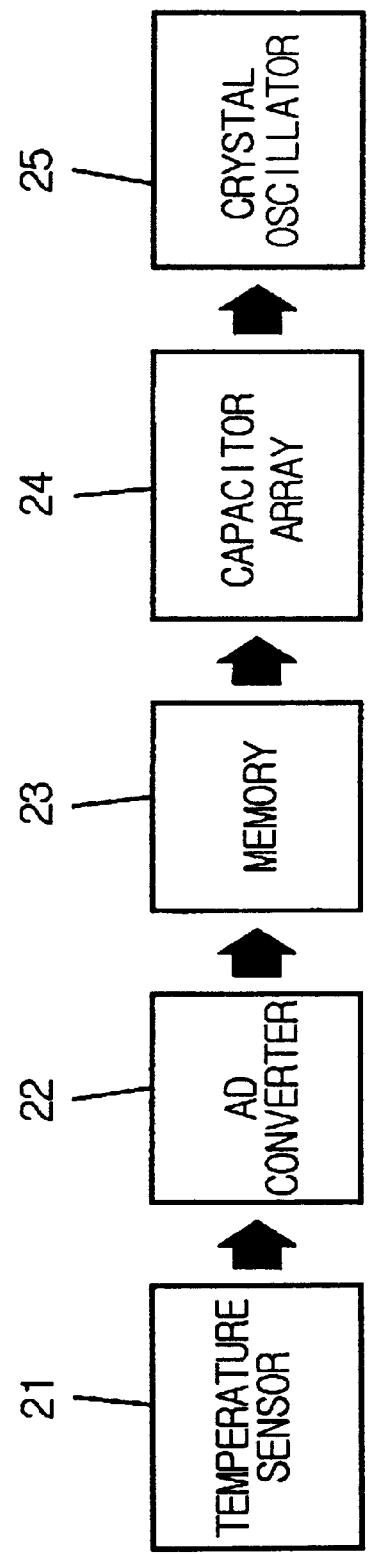
FIG. 2 shows a block diagram for illustrating another conventional digital temperature-compensated crystal oscillator.
Figure 3:
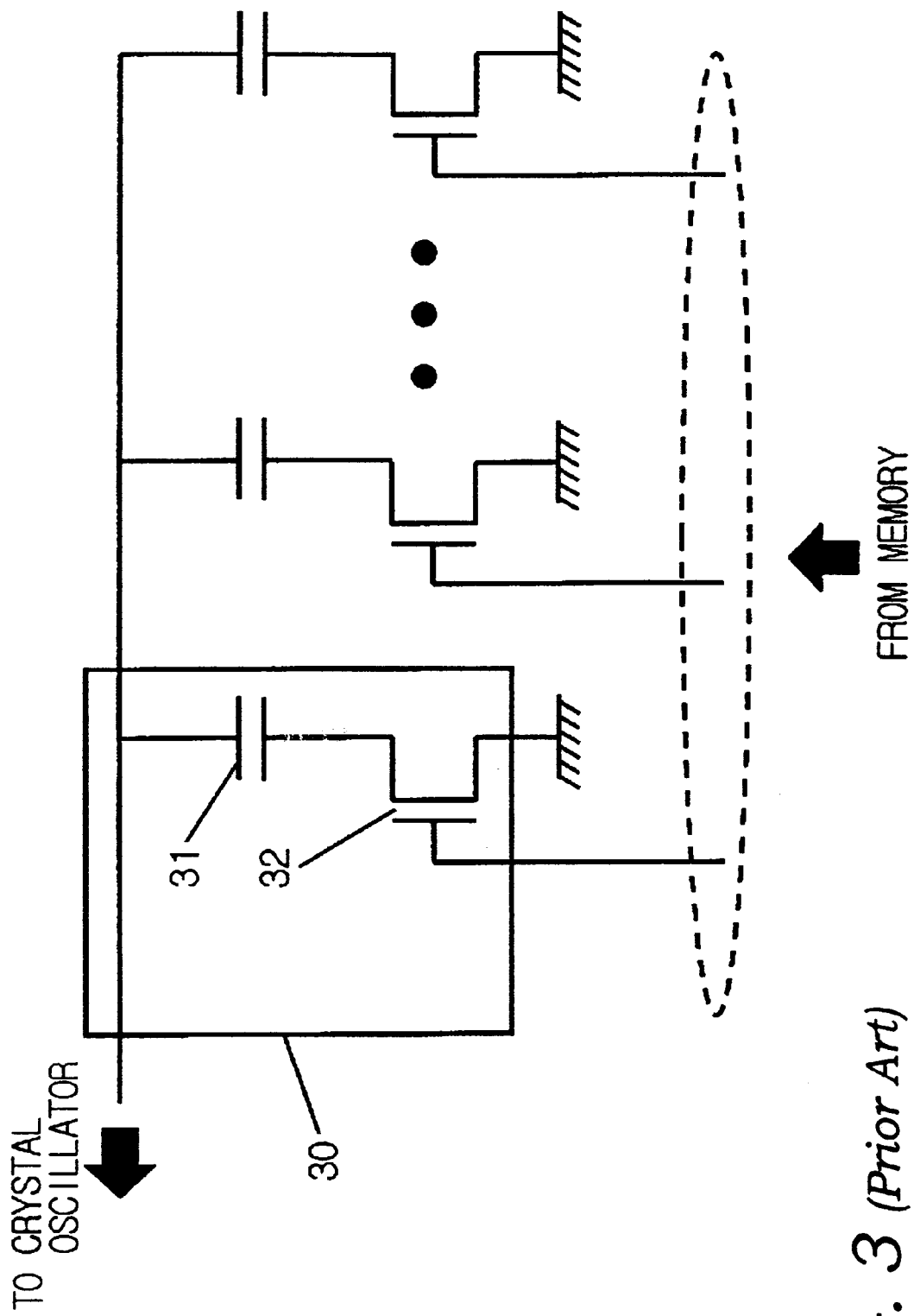
FIG. 3 shows a circuit of a conventional capacitor array.
Figure 4:
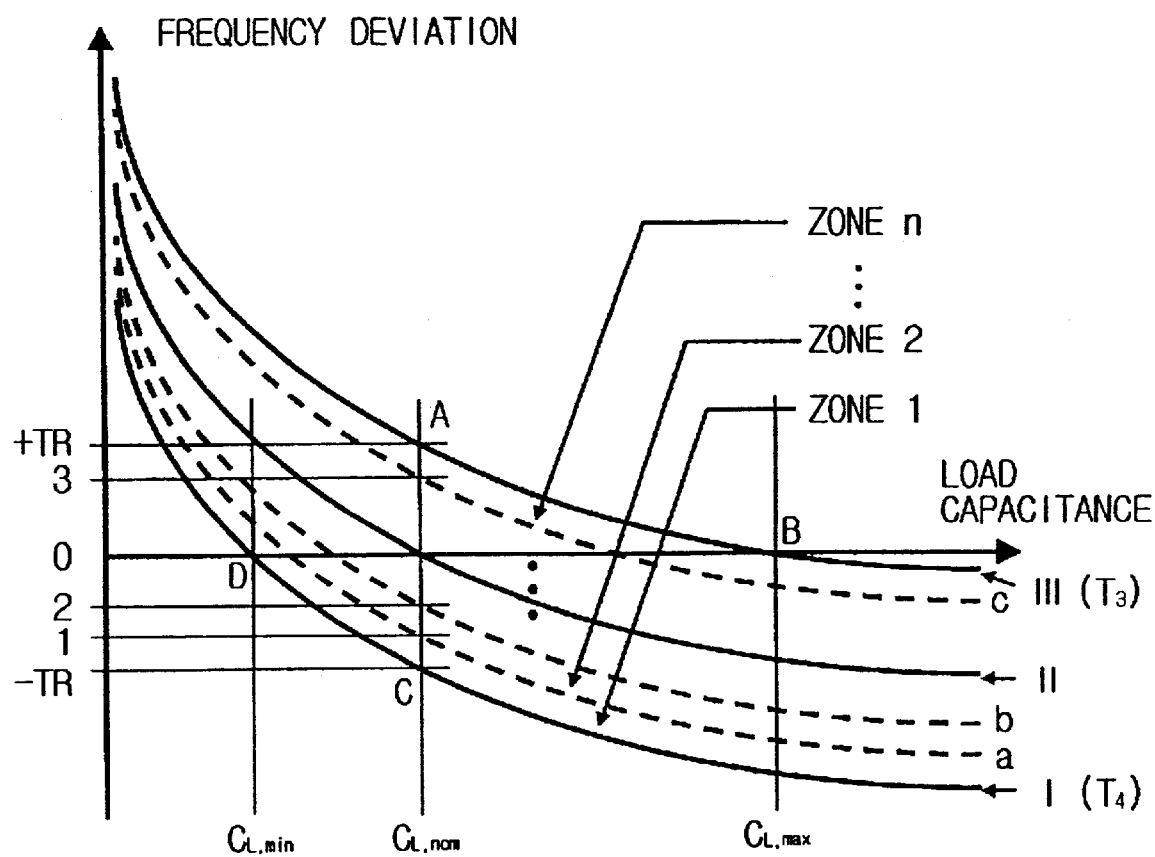
FIG. 4 shows a graph for illustrating variation in a resonant frequency of a crystal oscillator as a load capacitance applied on the crystal oscillator varies.

In FIG. 4, graphs for exemplifying variation of the resonant frequency as varying the load capacitance are shown. In the graphs, Curve ∥ represents the resonant frequency when the surrounding temperature is at a normal temperature. At the normal temperature, the resonant frequency has a proper value without any frequency deviation when the load capacitance is normal value $C_{L,nom}$. If the surrounding temperature varies to a temperature $T_3$ in the practical temperature range, the resonant frequency is also varied to assume Curve ||| in FIG. 4. When the resonant frequency assumes Curve |||, it is required to vary the value of the load capacitance to have the maximum value $C_{L,max}$ in order to obtain the proper value of the resonant frequency without any frequency deviation. If the surrounding temperature varies to another temperature $T_4$ in the practical temperature range, the resonant frequency is also varied to assume Curve | in FIG. 4. When the resonant frequency assumes Curve |, it is required to vary the value of the load capacitance to have the minimum value $C_{L,min}$ in order to obtain the proper value of the resonant frequency without any frequency deviation.

In FIG. 4, +TR is the maximum value of the resonant frequency in the practical temperature range, while −TR is the minimum value.

As for Curve |||, the resonant frequency becomes the maximum value +TR when the load capacitance is the normal value $C_{L,nom}$. In this case, therefore, it is needed to control the capacitor array so that load capacitance is increased to the maximum capacitance $C_{L,max}$. $C_{L,max}$ is the maximum capacitance of the capacitor array used in compensating a frequency deviation in the resonant frequency ranging from the minimum value −TR to the maximum value +TR in the practical temperature range As for Curve |, the resonant frequency becomes the minimum value −TR when the load capacitance is the normal value $C_{L,nom}$. In this case, therefore, it is needed to control the capacitor array so that load capacitance is decreased to the minimum capacitance $C_{L,min}$. $C_{L,min}$ is the minimum capacitance of the capacitor array used in compensating a frequency deviation in the resonant frequency ranging from the minimum value −TR to the maximum value +TR in the practical temperature range.

Among all of the curves shown in FIG. 4, that is Curve |, Curve ||, Curve ||| and other curves a, b and c, Curve | is the most steep curve that the resonant frequency varies most susceptibly as the load capacitance varies. In other words, the gradient of Curve | between two points C and D is more steep than the gradient of Curve ||| between other two points A and B. Since the resonant frequency on Curve | is significantly varied if the load capacitance is slightly varied, it is required to control more precisely than controlling the resonant frequency on the other curves.

Accordingly, the smallest capacitance of the unit capacitor constituting the capacitor array is decided in consideration of preciseness required in controlling the resonant frequency on Curve |. The number of the unit cells is decided so that a load capacitance ranging from the minimum value $C_{L,min}$ to the maximum value $C_{L,max}$ capacitance is produced by combining their unit capacitors having the smallest capacitance.

While the gradient of Curve ||| between the points A and B is less steep than the gradient of Curve | between the points C and D, more amount of variation of the load capacitance is required in compensating variation of the resonant frequency on Curve ||| between the points A and B than an amount of variation of the load capacitance required in compensating variation of the resonant frequency on Curve | between the points C and D. Accordingly, in order to constitute a capacitor array for producing the load capacitance required in compensating variation of the resonant frequency on Curve ||| between the points A and B using the unit capacitors having the smallest capacitance, numerous unit cells are required. However, there is not required so preciseness in compensating variation of the resonant frequency on Curve ||| between the points A and B.

In this embodiment, the entire range of variation in the resonant frequency through the practical temperature range is divided into a number of zones, that is, Zone 1, Zone 2, . . . , Zone n, in which variation curves having similar gradients belong to a zone as shown in FIG. 4. Then, variation of the resonant frequency on variation curves belonging to a zone is compensated by load capacitance produced by unit capacitors having a proper capacitance. For example, variation of the resonant frequency on variation curves belonging to Zone 1 is compensated by load capacitance produced by a first group of unit capacitors. Each unit capacitor of the first group of unit capacitors has a capacitance decided from Curve | that has the largest gradient among the first group of variation curves belonging to Zone 1. Variation of the resonant frequency on variation curves belonging to Zone 2 is compensated by load capacitance produced by a second group of unit capacitors. Each unit capacitor of the second group of unit capacitors has a capacitance decided from Curve a that has the largest gradient among the second group of unit capacitors belonging to Zone 2. Variation of the resonant frequency on variation curves belonging to Zone 3 is compensated by load capacitance produced by a third group of unit capacitors. Each unit capacitor of the third group of unit capacitors has a capacitance decided from Curve b that has the largest gradient among the third group of unit capacitors belonging to Zone 3. Variation of the resonant frequency on variation curves belonging to Zone n is compensated by load capacitance produced by an $n^{th}$ group of unit capacitors. Each unit capacitor of the $n^{th}$ group of unit capacitors has a capacitance decided from Curve c that has the largest gradient among the $n^{th}$ group of unit capacitors belonging to Zone n.

In order to define variation zones of the resonant frequency as to a crystal oscillator, it is required to analyze temperature characteristics of the resonant frequency of the crystal resonator. FIG. 5 shows an example of the temperature characteristics of the resonant frequency of an illustrative crystal oscillator. In FIG. 5, the crystal resonator operates in a practical temperature range between $T_1$ and $T_2$. If a current surrounding temperature exists between a and $T_2$, a frequency deviation of the resonant frequency exists between −TR and 1, and this variation is grouped to belong to Zone 1. In this way, variation of the resonant frequency when a current surrounding temperature exists between a and b is grouped to belong to Zone 2, while variation of the resonant frequency when a current surrounding temperature exists between $T_1$ and c is grouped to belong to Zone n.

Therefore, after sensing a current temperature surrounding a crystal resonator, checking a temperature zone to which the current temperature belongs, and then deciding what curve and what variation zone a frequency deviation in the resonant frequency of the crystal oscillator should be compensated on, a capacitor array comprising unit capacitors having an optimum capacitance to compensate the frequency deviation is selected. In other words, a number of capacitor arrays comprising unit capacitors having different capacitances are provided so that one of the capacitor arrays comprising unit capacitors having an optimum capacitance regarding a current surrounding temperature is selected. Accordingly, these capacitor arrays are called as temperature-adaptive capacitor arrays.

In the temperature-adaptive capacitor arrays, the optimum capacitance of the unit capacitors constituting each capacitor array is decided in consideration of control preciseness required in a temperature zone. The temperature zone is one of zones into which a practical operation temperature range of a crystal oscillator is divided in consideration of control preciseness required through the practical operation temperature range. In other words, a practical operation temperature range of an crystal oscillator is divided into several zones in consideration of control preciseness, that is, susceptibility of variation in the resonant frequency of the crystal oscillator to variation in its load capacitance. An optimum capacitance of unit capacitors constituting a capacitor array used in compensating a frequency deviation in the resonant frequency when the crystal oscillator operates in one of the zones is decided in consideration of control preciseness required in the one of the zones. Then, the capacitor array comprising the unit capacitors having the optimum capacitance is operatively connected to the crystal oscillator to be used when the crystal oscillator operates in the one of the zones.

In another aspect of this invention, a TCXO is constituted using the temperature-adaptive capacitor arrays.

FIG. 6 shows a block diagram for illustrating a preferred embodiment of the TCXO including the temperature-adaptive capacitor arrays. The TCXO in accordance with this embodiment comprises a crystal oscillator 68, a temperature sensor 61 for outputting an electric signal corresponding to a surrounding temperature, an AD converter 62 for converting the electric signal outputted in analog form into a digital signal, a memory 64 for storing division data of temperature zones for the crystal oscillator 68 and switching control codes for the capacitor arrays, a control unit 63 for deciding what temperature zone is used by comparing the surrounding temperature sensed by the temperature sensor 61 to the division data of temperature zones stored in the memory 64, and for selecting a proper one of the switching control codes stored in the memory 64, and decoder assembly 65 for providing two capacitor banks 66 and 67 with the switching control code selected by the control unit 63.

Each capacitor bank 66 or 67 comprises a number of capacitor arrays. The number of capacitor arrays allocated in each capacitor bank 66 or 67 is n, respectively. Capacitor Array 1 through Capacitor Array n in each capacitor bank 66 or 67 corresponds to Zone 1 through Zone n in FIG. 4, respectively. In order to obtain the best control performance, two capacitor banks 66 and 67 are not only identical with each other but also controlled by a common control code. All of the unit capacitors included in the capacitor arrays allocated in each capacitor bank 66 or 67 are connected to a common line to form a parallel capacitor circuit through the crystal resonator 60 and an earth. Two capacitor banks 66 and 67 are also connected to form a parallel capacitor circuit with each other to provide a load capacitance to the crystal oscillator 68. Each unit capacitor is switched on or off by a switching element, of which operation is controlled by a switching control code provided through the decoder assembly 65.

The TCXO according to this invention is produced as a compact chip, for example, through a CMOS production process. With the TCXO, it is realized to reduce electric power consumption upon operation and to reduce a silicon area occupied by its circuitry. This means that a portable signal equipment using the TCXO is embodied as a low-power-consumptive, compact and low-cost equipment.

Although a pierce oscillator is illustrated in FIG. 6, this invention can be applied on any other crystal oscillator well.

Although there is explained about compensation of a frequency deviation due to variation of a temperature in the detailed explanation of this invention, this invention can be applied on compensation of a frequency deviation due to variation of any other physical properties well. Furthermore, although the present invention is explained with preferred embodiments, it should be understood that they are only for illustrating other than limiting the invention. Those who are skilled in the art, to which the invention is attributed, will appreciate that various modifications, alterations and modulations are possible without departing from the scope and spirit of the present invention as defined in the accompanying claims.

What is claimed is:

1. A temperature-adaptive capacitor bank used in keeping a constant resonant frequency of a crystal oscillator by varying a load capacitance on the crystal oscillator although a temperature surrounding the crystal resonator varies, wherein the temperature-adaptive capacitor bank comprises:
   a number of capacitor arrays comprising unit capacitors adapted to be individually switched on or off and operatively connected to the crystal oscillator to produce a load capacitance on the crystal oscillator;
   the unit capacitors belonging to one of the capacitor arrays having an equivalent capacitance with each other;
   two unit capacitors belonging to different capacitor arrays having different capacitances from each other; and
   the capacitance of the unit capacitors belonging to each capacitor array being set in consideration of control preciseness required in compensating a frequency deviation in the resonant frequency of the crystal oscillator as the temperature varies in at least a portion of a practical temperature range, within which the crystal oscillator operates.

2. The temperature-adaptive capacitor bank according to claim 1, wherein the temperature-adaptive capacitor bank comprises the same number of capacitor arrays with the number of zones divided from the practical temperature range in consideration of variation of the resonant frequency of the crystal oscillator as the load capacitance on the crystal oscillator varies.

3. The temperature-adaptive capacitor bank according to claim 2, wherein the capacitor arrays and the zones divided from the practical temperature range correspond to each other by one to one, and wherein the capacitance of the unit capacitors belonging to one of the capacitor arrays is set in consideration of control preciseness required in compensating a frequency deviation in the resonant frequency of the crystal oscillator as the temperature varies in one of the zones to which the one of the capacitor arrays corresponds.

4. The temperature-adaptive capacitor bank according to claim 3, wherein the capacitance of the unit capacitors belonging to one of the capacitor arrays is decreasingly set as the variation of the resonant frequency of the crystal oscillator is increased as the load capacitance on the crystal oscillator varies.

5. The temperature-adaptive capacitor bank according to claim 4, wherein the temperature-adaptive capacitor bank further comprises switching elements provided to the unit capacitors by one by one.

6. A temperature-compensated crystal oscillator for outputting a constant resonant frequency of a crystal oscillator by varying a load capacitance on the crystal oscillator although a temperature surrounding the crystal resonator varies, wherein the temperature-compensated crystal oscillator comprises:

a temperature sensor for sensing the temperature surrounding the crystal resonator;

one or more temperature-adaptive capacitor banks connected to the crystal oscillator; and a control unit for controlling the temperature-adaptive capacitor banks to produce a proper load capacitance on the crystal oscillator as the temperature varies, wherein each temperature-adaptive capacitor bank comprises:

a number of capacitor arrays comprising unit capacitors being individually switched on or off and operatively connected to the crystal oscillator;

the unit capacitors belonging to one of the capacitor arrays having the same capacitance with each other;

two unit capacitors belonging to different capacitor arrays having different capacitances from each other; and the capacitance of the unit capacitors belonging to each capacitor array being set in consideration of control preciseness required in compensating a difference frequency in the resonant frequency of the crystal oscillator as the temperature varies in at least a portion of a practical temperature range, within which the crystal oscillator operates.

7. The temperature-compensated crystal oscillator according to claim 6, wherein each temperature-adaptive capacitor bank comprises the same number of capacitor arrays with the number of zones divided from the practical temperature range in consideration of variation of the resonant frequency of the crystal oscillator as the load capacitance on the crystal oscillator varies.

8. The temperature-compensated crystal oscillator according to claim 7, wherein the capacitor arrays and the zones divided from the practical temperature range correspond to each other by one to one, and wherein the capacitance of the unit capacitors belonging to one of the capacitor arrays is set in consideration of control preciseness required in compensating a frequency deviation in the resonant frequency of the crystal oscillator as the temperature varies in one of the zones to which the one of the capacitor arrays corresponds.

9. The temperature-compensated crystal oscillator according to claim 8, wherein the capacitance of the unit capacitors belonging to one of the capacitor arrays is decreasingly set as the variation of the resonant frequency of the crystal oscillator is increased as the load capacitance on the crystal oscillator varies.

10. The temperature-compensated crystal oscillator according to claim 9, wherein the temperature-compensated crystal oscillator further comprises:

switching elements provided to the unit capacitors by one by one;

a memory for storing control codes used for switching on or off the unit capacitors in accordance with the temperature surrounding the crystal resonator sensed by the temperature sensor; and the control unit for switching on or off each unit capacitor using a control code selected in consideration of the temperature so that the temperature-adaptive capacitor banks produce a proper load capacitance on the crystal oscillator.

\* \* \* \* \*

UNITED STATES PATENT AND TRADEMARK OFFICE
CERTIFICATE OF CORRECTION

PATENT NO.    : 6,281,761 B1
DATED         : August 28, 2001
INVENTOR(S)   : Hyung Cheol Shin et al.

It is certified that error appears in the above-identified patent and that said Letters Patent is hereby corrected as shown below:

<u>Title page,</u>
Item [73], Assignee, it should read as follows: "Korea Advanced Institute of Science and Technology and Shinsung Electronics Co., Ltd.".

Signed and Sealed this

Second Day of July, 2002

Attest:

Attesting Officer

JAMES E. ROGAN
*Director of the United States Patent and Trademark Office*